United States Patent [19]

Kondo et al.

[11] 4,314,377
[45] Feb. 2, 1982

[54] NOISE REMOVING APPARATUS

[75] Inventors: Sadao Kondo, Oota; Hiroyasu Kishi, Gunma, both of Japan

[73] Assignees: Sanyo Electric Co., Ltd., Moriguchi; Tokyo Sanyo Electric Co., Ltd., Gunma, both of Japan

[21] Appl. No.: 133,932

[22] Filed: Mar. 25, 1980

[30] Foreign Application Priority Data

Apr. 27, 1979 [JP] Japan ................... 54-52889
Jun. 1, 1979 [JP] Japan ................... 54-69106
Jun. 1, 1979 [JP] Japan ................... 54-69107

[51] Int. Cl.³ .................. H04B 1/12; H04H 5/00
[52] U.S. Cl. .................. 455/223; 179/1 GD; 328/165; 455/212; 455/304; 455/305
[58] Field of Search ................ 455/303–306, 455/312, 212, 218, 222–225; 179/1 P, 1 GD; 328/165

[56] References Cited

U.S. PATENT DOCUMENTS

4,066,845 1/1978 Kishi ..................... 455/212
4,195,203 3/1980 Sakai et al. ............. 179/1 GD
4,246,441 1/1981 Sugai et al. ............. 179/1 GD

FOREIGN PATENT DOCUMENTS

2029177 3/1980 United Kingdom .......... 179/1 GD

Primary Examiner—Marc E. Bookbinder
Attorney, Agent, or Firm—Darby & Darby

[57] ABSTRACT

A noise removing apparatus is interposed between an FM detecting circuit and a stereo demodulating circuit. The noise removing apparatus is responsive to a pulsive noise included in the output from the detecting circuit to enable a first gate to interrupt transmission of the output. Although the stereo pilot signal is disturbed during the interruption period, the disturbed stereo pilot signal is canceled by a pseudo-stereo pilot signal (a signal similar to the pilot signal) separately generated, whereby the disturbed stereo pilot signal is prevented from being applied to the stereo demodulating circuit.

17 Claims, 14 Drawing Figures

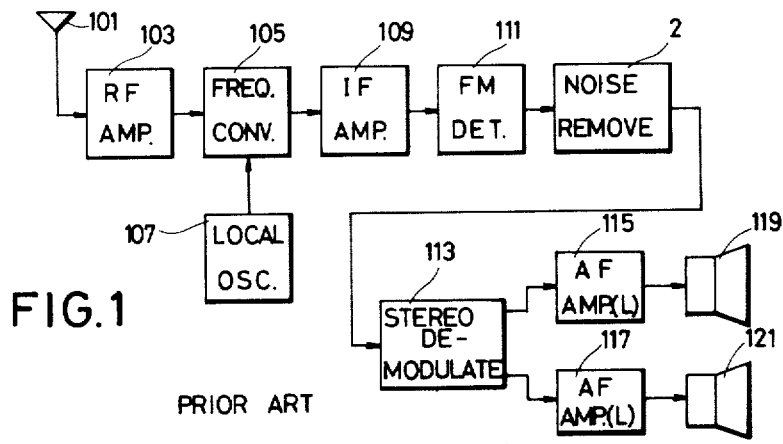
FIG.1  PRIOR ART
FIG.3
(A) WAVEFORM AT NODE "A" 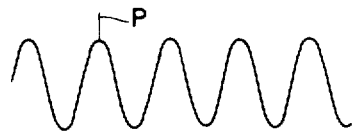
(B) WAVEFORM AT NODE "B" 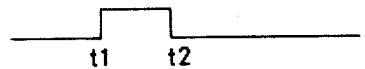
(C) WAVEFORM AT NODE "C" 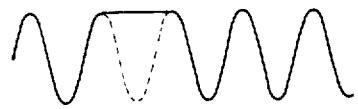
(D) WAVEFORM AT NODE "D" 
(E) WAVEFORM AT NODE "E" 

(A) WAVEFORM AT NODE "C"

(B) WAVEFORM AT NODE "F"

(C) WAVEFORM AT NODE "G"

(D) WAVEFORM AT NODE "H"

(E) WAVEFORM AT NODE "I"

(F) WAVEFORM AT NODE "E"

(A) WAVEFORM AT NODE "A"

(B) WAVEFORM AT NODE "B"

(C) WAVEFORM AT NODE "C"

(D) WAVEFORM AT NODE "D"

(E) WAVEFORM AT NODE "M"

(F) WAVEFORM AT NODE "N"

(G) WAVEFORM OF "C"+"M"

(H) WAVEFORM AT NODE "E"

NOISE REMOVING APPARATUS

BACKGROUND OF THE INVENTION

1. Field of the Invention

The present invention relates to a noise removing apparatus. More specifically, the present invention relates to an apparatus for removing a noise suited for removing a pulsive noise included in an FM stereo signal.

2. Description of the Prior Art

It has been well known that a pulsive noise such as an ignition noise generated by an automobile could interfere with normal reception by an FM receiver. Since such pulsive noise serves to phase modulate the FM signal, the same cannot be removed even by the use of a limiter and hence is transferred to a subsequent stage in the receiver after detection by a detector. Accordingly, it is necessary to remove such pulsive noise in a signal transmission path subsequent to a detector.

Referring to FIG. 1, there is shown a block diagram of an FM radio receiver employing a typical noise removing apparatus where the present invention can be advantageously employed. Referring to FIG. 1, the FM radio receiver shown comprises an antenna 101 for receiving a broadcast FM signal wave, a radio frequency amplifier 103 for amplifying the FM signal received by the antenna 101, a local oscillator 107 for generating a local oscillation signal for the purpose of frequency conversion, a frequency converter 105 for mixing the amplified FM signal from the radio frequency amplifier 103 with the local oscillation signal for converting the frequency of the FM signal into an intermediate frequency, an intermediate frequency amplifier 109 for amplifying the intermediate frequency signal from the frequency converter 105, an FM detector 111 for demodulating the intermediate frequency signal into the original low frequency signal, a stereo demodulating circuit 113 for demodulating the low frequency signal from the FM detector 16 into the original stereo signal, left and right audio frequency amplifiers 115 and 117 for amplifying the demodulated stereo left and right signals, and left and right loud speakers 119 and 121 for converting the ampified left and right audio frequency signals into the left and right sounds. Detailed structure and operation of the respective blocks are well known to those skilled in the art. Hence, it is not believed necessary to describe the same here in more detail.

In the FM stereo receiver shown, the output of the detector 111 is applied through a noise removing circuit 2 to the stereo demodulating circuit 113. The present invention is directed to an improvement in such a noise removing apparatus as shown in FIG. 1 which is interposed between the FM detector 111 and the stereo demodulating circuit 113.

An example of a noise removing apparatus of interest is disclosed in, for example, Japanese Patent Publication No. 15710/1964, published for opposition Aug. 5, 1964 and entitled "SYSTEM FOR REMOVING PULSIVE NOISE IN SIGNAL". The system disclosed in the above referenced Japanese Patent Publication No. 15710/1964 comprises a gate circuit in a signal transmission path. Upon detection of a pulsive noise, the gate circuit is placed in an interrupted state for a predetermined time period, so that the pulsive noise may not pass through the signal transmission path to a subsequent stage. A capacitor is also coupled to the output terminal of the gate circuit to hold a level. The capacitor serves to hold or store the level of the signal immediately before the gate circuit is interrupted. Since the above described prior art serves to supplement the signal voltage level stored in the capacitor when the gate circuit is interrupted, an advantage is brought about that a noise component is removed while the signal is less disturbed during the gate time period. Therefore, the above described prior art can be advantageously employed in reception of FM monaural broadcasting, in particular.

However, in the case where the above described prior art is utilized in reception of the FM stereo broadcasting, a new problem occurs that a stereo pilot signal is lost. Several types of noise removing apparatuses adapted for preventing a stereo pilot signal from being lost and hence suited for reception of the FM stereo broadcasting, in particular, have been proposed and put into practical use. One type of such apparatus of interest is disclosed in the U.S. Pat. No. 3,739,285 issued June 12, 1973. Briefly described, the apparatus disclosed in the above referenced U.S. Pat. No. 3,739,285 comprises a capacitor which is the same as that of the previously described prior art and a parallel resonance circuit connected in series with the capacitor. The parallel resonance frequency of the parallel resonance circuit is selected to be the frequency of a pilot signal contained in an FM stereo broadcasting signal, say 19 kHz. Accordingly, the signal level immediately before the gate circuit interrupts the signal is held or stored and at the same time a pilot signal obtained from the parallel resonance circuit is applied to a stereo demodulating circuit. Since the apparatus is so structured, the gate circuit is opened upon detection of a pulsive noise, so that such pulsive noise component is prevented from being applied to the stereo demodulating circuit. Furthermore, since the signal level has been held in the capacitor when the gate circuit is thereafter closed again, continuity of the signal is established. Accordingly, the apparatus disclosed in the U.S. Pat. No. 3,739,285 can effectively remove a pulsive noise, while preventing the pilot signal for the stereo demodulating circuit from being lost. Although the above referenced U.S. Pat. No. 3,739,285 has been improved in that the stereo pilot signal is prevented from being lost, another resonance is caused by the holding capacitor and the parallel resonance circuit. More specifically, one series resonance circuit is formed by a capacitor for holding the signal level and a parallel resonance circuit and the series resonance frequency thereof causes a distortion in a signal being applied to the stereo demodulating circuit. The frequency causing such distortion is necessarily lower than the resonance frequency of the parallel resonance circuit and falls in an audible frequency region, with the result that a distorted sound is naturally heard from a speaker. Such series resonance causes further problems.

In order to eliminate the above described problems, the same assignee as that of the present invention previously proposed a novel noise removing apparatus which was improved over the above referenced U.S. Pat. No. 3,739,285 and issued Jan. 3, 1978 as U.S. Pat. No. 4,066,845. The above referenced U.S. Pat. No. 4,066,845 is adapted to prevent a stereo pilot signal from being lost by means of an oscillation circuit during a time period when a gate circuit is interrupted.

Another circuit for removing a pulsive noise of interest is proposed in Japanese Utility Model Laying Open No. 106608/1978 laid open Aug. 26, 1978 for public inspection. The pulsive noise removing apparatus disclosed in the above referenced Japanese Utility Model Laying Open No. 106608/1978 comprises a trap circuit. More specifically, in such a noise removing apparatus as shown in the above referenced Japanese Patent Publication No. 15710/1964, a stereo composite signal is provided wherein a stereo pilot signal has been removed by a trap circuit. More specifically, a stereo pilot signal is removed in advance from a stereo composite signal by means of a trap circuit, whereupon the stereo composite signal with the stereo pilot signal removed is applied to the gate circuit. The above described noise removing apparatus has eliminated such an adverse influence that a stereo pilot signal is lost because of a signal level holding capacitor, inasmuch as no stereo pilot signal exists in a signal transmission path. However, insertion of a trap circuit in a signal transmission path increases the width or duration of a pulsive noise, which necessitates an increased interruption period by a gate circuit. Accordingly, a disadvantage is encountered that discontinuity of a stereo composite signal is undesirably increased.

SUMMARY OF THE INVENTION

According to the present invention, an improved apparatus is provided which removes a noise from a composite signal including an information signal and a reference signal. The apparatus comprises a first gate for interrupting transmission of the composite signal for a predetermined time period upon detection of a noise component included in the composite signal and a store means coupled to the output of the first gate for holding the level of the composite signal immediately before the first gate interrupts the transmission thereof. A pseudo-reference signal having substantially the same frequency as that of the reference signal is generated based on the reference signal included in the composite signal. The apparatus further comprises a second gate for interrupting transmission of the pseudo-reference signal for the above described predetermined time period. The apparatus further comprise a signal synthesizing circuit for synthesizing the output of the store means and the output of the second gate circuit during a time period convering at least the above described predetermined time period. As a result, the reference signal disturbed during the time period covering at least the above described predetermined time period is offset, whereby the disturbed reference signal is prevented from being applied to a subsequent stage circuit.

According to the present invention, since a disturbed reference signal or a stereo pilot signal is prevented from being applied to a stereo demodulating circuit, for example, in such an apparatus as an FM stereo receiver, any adverse influence caused by a disturbed stereo pilot signal can be fully eliminated. Furthermore, since the signal synthesizing circuit can be provided immediately before a stereo demodulating circuit, it is possible to advantageously adapt a phase relation between the reference signal in the signal synthesizing circuit and the pseudo-reference signal.

In a preferred embodiment of the present invention, a second store circuit having the same time constant as that of the first store circuit is coupled to the output of the second gate circuit. Accordingly, the second store circuit holds the signal level attained immediately before the second gate circuit interrupts the pseudo-reference signal. According to the embodiment in discussion, the signal synthesizing circuit is structured to synthesize the output of the first store circuit and the output of the second store circuit. Accordingly, the above described disturbed reference signal can be more fully removed.

In a further preferred embodiment of the present invention, means is provided for adjusting the amplitude of the pseudo-reference signal. The amplitude adjusting means comprises, for example, a synchronous detecting circuit responsive to the pseudo-reference signal and the output from the signal synthesizing circuit for providing an amplitude controlling signal associated with the level of the reference signal component included in the output of the signal synthesizing circuit, and a variable gain amplifier coupled to receive the amplitude control signal obtained from the synchronous detecting circuit. According to the embodiment in discussion, since the amplitude of the pseudo-reference signal can be adjusted until the reference signal component comes not to be included in the output of the signal synthesizing circuit, the disturbed reference signal can be more fully prevented from being transmitted to the subsequent stage.

In still a further preferred embodiment of the present invention, a third gate operable in a manner complementary to the first and second gates is interposed between the second store circuit and the signal synthesizing circuit. Accordingly, in the absence of a disturbed reference signal, i.e. in the absence of a detected noise component, a normal reference signal is transmitted from the first store circuit through the signal synthesizing circuit to the subsequent stage. When the reference signal becomes disturbed upon detection of a noise, the pseudo-reference signal and the reference signal are synthesized in the signal synthesizing circuit, so that a portion of the disturbed reference signal is removed. Further, a fourth gate operable in a manner complementary to the first and second gates is provided, so that a separate normal reference signal is supplemented through the fourth gate during the time period when the disturbed reference signal is removed. Accordingly, the output of the signal synthesizing circuit always contains the normal reference signal.

Accordingly, a principal object of the present invention is to provide a noise removing apparatus that is capable of effectively removing only a noise component.

Another object of the present invention is to provide a noise removing apparatus for preventing a disturbed reference signal from being transmitted to a subsequent stage circuit even when a reference signal included in a composite signal is disturbed because of an operation of a gate circuit responsive to detection of a noise component.

A further object of the present invention is to provide a noise removing apparatus that is capable of preventing more fully the transmission of a disturbed reference signal even when a reference signal included in a composite signal is disturbed because of an operation of a gate circuit responsive to detection of a noise component.

Still a further object of the present invention is to provide a noise removing apparatus which always supplies a normal reference signal to a subsequent stage circuit even when a reference signal included in a composite signal is disturbed because of an operation of a gate circuit responsive to detection of a noise component.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing one example of a typical FM stereo receiver employing a common noise removing apparatus, in which the present invention can be advantageously employed;

FIG. 3 is a graph showing waveforms at various portions in the FIG. 2 embodiment for depicting an operation thereof;

DESCRIPTION OF THE PREFERRED EMBODIMENTS

Figure 2:
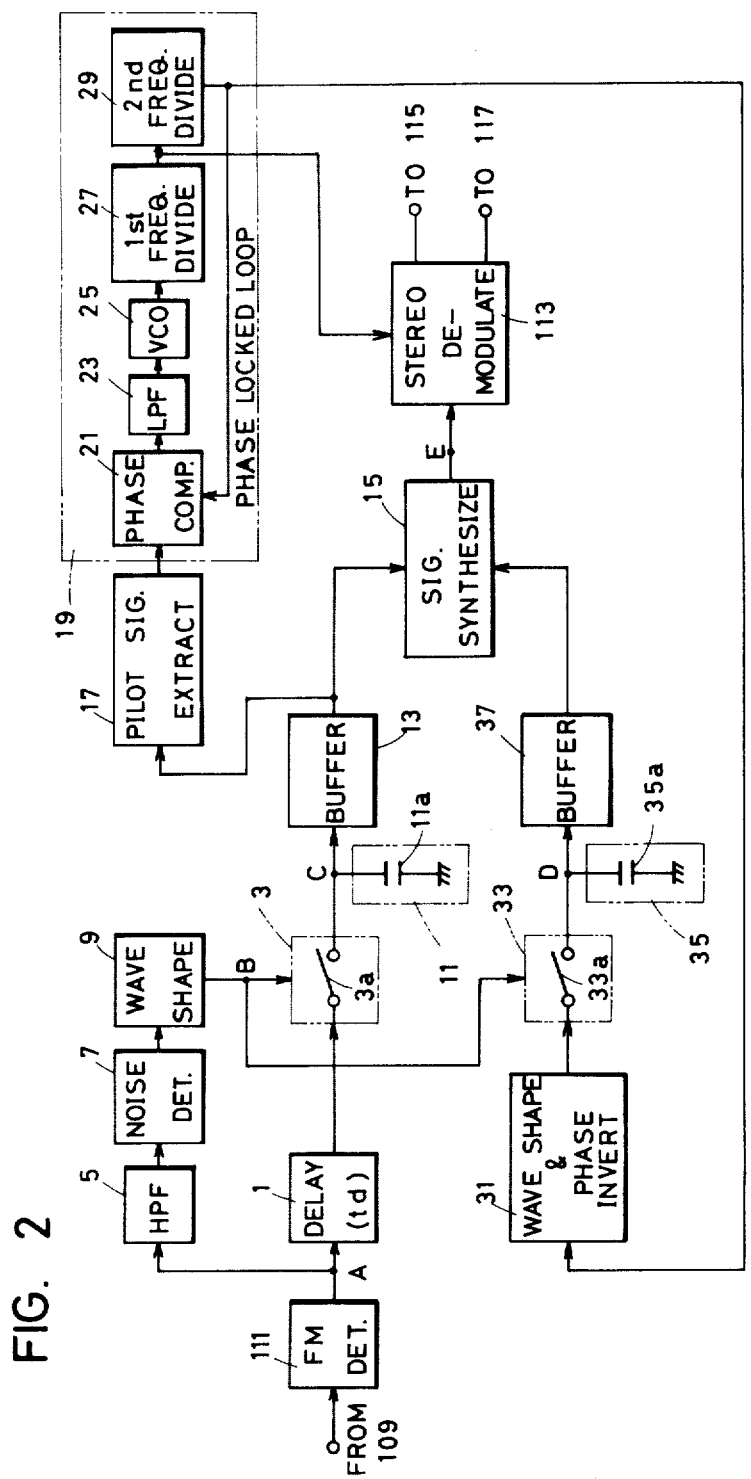
FIG. 2 is a block diagram showing one embodiment of the present invention.

FIG. 2 is a block diagram showing one embodiment of the present invention. As in case of the FIG. 1 block diagram, the FM detector 111 is connected to receive the output of the intermediate frequency amplifier 109 and the detected output is applied to the node A. The detected output signal of the composite signal obtained at the node A of the FM detector 111 is applied to a low pass filter or a delay circuit 1 for delaying the output signal for a predetermined time period td. The output from the delay circuit 1 is applied to a gate circuit 3. The output of the FM detector 111, i.e. the composite signal obtained from the node A is applied to a high pass filter 5. The high pass filter 5 is aimed to extract only a high frequency component from the output signal, i.e. the composite signal and the output thus obtained is applied to a noise detector 7. The noise detector 7 may comprise a Schmidt circuit or a level detector, for example, and provides a noise detected output to a wave shaping circuit 9, if and when the level of the high frequency component extracted by the high pass filter 5 exceeds a predetermined value. The wave shaping circuit 9 comprises a monostable multivibrator, for example, and is triggered responsive to the signal obtained from the noise detector 7 to provide a pulse signal lasting for a predetermined time period, i.e. a time period "t1-t2" to be described subsequently, which is obtained from the node B as a gate control signal. Accordingly, the gate 3a of the gate circuit is responsive to the gate control signal obtained from the wave shaping circuit 9 to be operable to interrupt the signal obtained from the delay circuit 1 for the time period when the gate control signal is obtained. A first holding circuit 11 is connected to the output terminal of the gate circuit 3. The first holding circuit 11 comprises a first capacitor 11a, so that a signal level immediately before interruption is held when the signal is interrupted by the gate circuit 3. The output of the first holding circuit 11 is applied through a buffer circuit 13 to one input of a signal synthesizing circuit 15 and is also applied to a pilot signal extracting circuit 17.

The pilot signal extracting circuit 17 extracts a pilot signal, i.e. a reference signal from the FM detected output, i.e. the composite signal obtained through the buffer circuit 13 to supply the same to a phase locked loop 19. The phase locked loop 19 is aimed to generate a subcarrier wave signal for stereo demodulation of 38 kHz locked to the stereo pilot signal of 19 kHz extracted from the pilot signal extracting circuit 17. The phase locked loop 19 comprises a phase comapator 21, a low pass filter 23, a voltage controlled oscillator 25 and a first frequency divider 27 and may further comprise a second frequency divider 29, in a well known manner. Accordingly, the output of the first frequency divider 27 is applied as a subcarrier wave signal of 38 kHz to the stereo demodulating circuit 113 and is also applied to the second frequency divider 29. The second frequency divider 29 frequency divides the signal of 38 kHz to a signal of 19 kHz and the output thereof is fedback to the phase comparator 21 and is also applied to a wave shaping/phase inverting circuit 31.

The wave shaping/phase inverting circuit 31 shapes the waveform of the output from the second frequency divider 29 included in the phase locked loop 19, i.e. the signal of 19 kHz and at the same time inverts the phase thereof. Thus, the signal having a predetermined phase relation with respect to the stereo pilot signal, i.e. a pseudo-reference signal, is obtained by means of the phase locked loop 19 and the wave shaping/phase inverting circuit 31. The pseudo-reference signal is applied to a second gate circuit 33. As in the case of the first gate circuit 3, the second gate circuit 33 is controlled responsive to the gate control signal obtained from the wave shaping circuit 9, so that upon receipt of the gate control signal the pseudo-reference signal is interrupted by the gate 33a during a time period of the gate control signal. A second holding circuit 35 is connected to the output terminal of the second gate circuit 33. The second holding circuit 35 comprises a second capacitor 35a, so that the same holds the level of the pseudo-reference signal immediately before interruption when the pseudo-reference signal is interrupted by the gate circuit 33. More specifically, the second holding circuit 35 performs the same operation as that of the first holding circuit 11. The output from the second holding circuit 35 is applied through the buffer circuit 37 which is the same as the buffer circuit 13 to the other input of the signal synthesizing circuit 15. The signal synthesizing circuit 15 comprises an adder circuit, for example, so that two input signals are added, and an output thereof is applied to the stereo demodulating circuit 113. The output of the stereo demodulating circuit 113 is applied to the amplifiers 115 and 117 as in case of the FIG. 1 diagram.

In operation, first consider a case where no pulsive noise component exists in the output signal from the FM detector 111, i.e. the composite signal. In such a case, the composite signal obtained from the node A is delayed by a time period td by means of the delay circuit 1 and is applied to the gate circuit 3. In the absence of a noise component in the composite signal, no output is obtained from the noise detector 7 and accordingly no gate control signal is obtained from the wave shaping circuit 9. Therefore, the gate 3a included in the gate circuit 3 is kept in a conductive state. Accordingly, the output of the delay circuit 1 is held in the capacitor of the holding circuit 11 through the gate circuit 3. At the same time, the held signal i.e. the stereo composite signal is applied through the buffer circuit 13 to the pilot signal extracting circuit 17. Accordingly, the stereo pilot signal included in the composite signal is extracted by the extracting circuit 17 and is applied to the phase locked loop 119. Accordingly, phase comparator 21 makes phase comparison of the stereo pilot signal obtained from the extracting circuit 17 and the signal of 19 kHz obtained from the second frequency divider 29. Therefore, the low pass filter 23 provides a voltage associated with the phase difference therebetween to the voltage controlled oscillator 25 as an oscillation control voltage. The voltage controlled oscillator 25 has an oscillation frequency of 76 kHz and the output is frequency divided by the first frequency divider 27 to 38 kHz, which is used as a subcarrier wave signal. A rectangle wave signal of 19 kHz having the same phase as that of the stereo pilot signal is obtained from the second frequency divider 29. The rectangle wave signal of 19 kHz obtained from the second frequency divider 29 is applied to the wave shaping/phase inverting circuit 31. The wave shaping/phase inverting circuit 31 comprises a parallel resonance circuit or integrating circuit, for example, so that the rectangle wave signal of 19 kHz obtained from the second frequency divider 29 is converted into the sine wave of a triangle wave of the phase opposite to that of the stereo pilot signal. The output of the wave shaping/phase inverting circuit 31 is applied to the second gate circuit 33. The gate 33a of the second gate circuit 33 is in a conductive state at that time, as is the gate 3a of the first gate circuit 3. Accordingly, the pseudo-reference signal obtained from the wave shaping/phase inverting circuit 31 is held by the capacitor 35a of the holding circuit 35.

The stereo composite signal held in the capacitor 11a of the above described holding circuit 11, i.e. the signal obtained from the node C, and the pseudo-reference signal held in the capacitor 35a of the holding circuit 35, i.e. the signal obtained from the node D, are applied through the buffer circuits 13 and 37 to the signal synthesizing circuit 15. The signal synthesizing circuit 15 comprises an adder circuit, for example, so that these two inputs, i.e. the stereo composite signal obtained from the node C and the pseudo-reference signal obtained from the node D, are added. Accordingly, the pilot signal included in the stereo composite signal obtained from the node C, i.e. the reference signal, is canceled by the pseudo-reference signal obtained from the node D. Therefore, it follows that only a stereo composite signal with the stereo pilot signal removed is obtained at the output of the signal synthesizing circuit 15, i.e. at the input or the node E of the stereo demodulating circuit 113. Meanwhile, since the stereo demodulating circuit 113 is supplied with the subcarrier wave signal of 38 kHz obtained from the first frequency divider 27 included in the phase locked loop 19, stereo demodulation can be performed.

Now referring to the waveforms shown in FIG. 3, description will be made of a case where a pulsive noise is included in the stereo composite signal obtained from the FM detector 111. It is pointed out that for simplicity of depiction and understanding the FIG. 3 waveforms have been illustrated on the assumption that only the stereo pilot signal of 19 kHz exists as the output signal of the FM detector 111, i.e. an FM stereo broadcasting signal is being received wherein no audio signal is modulated.

Now consider a case where a pulsive noise P is included at the timing t1 in the stereo composite signal obtained at the node A, i.e. in the stereo composite signal as shown as (A) in FIG. 3. In such a case the pulsive noise P passes through the high pass filter 5 and is detected by the noise detector 7. Accordingly, a gate control signal assuming the high level during a predetermined time period from the timing t1 to the timing t2 as shown as (B) in FIG. 3 is obtained from the wave shaping circuit 9. Therefore, the first and second gates 3a and 33a of the first and second gate circuits 3 and 33 are placed in an interrupted state. The delay time td of the delay circuit 1 has been selected to be substantially the same as a time period in which the pulsive noise passes from the high pass filter 5 to the wave shaping circuit 9. Accordingly, it follows that immediately before the pulsive noise P reaches the first gate circuit 3 the first gate circuit 3, i.e. the first gate 3a has been interrupted. The gate circuits 3 and 33 are placed in an interrupted state for a predetermined time period t1 to t2 upon occurrence of the pulsive noise P. The capacitors 11a and 35a of the holding circuits 11 and 35 hold the respective signal levels immediately before interruption of the first and second gate circuits 3 and 33. Accordingly, the signal levels immediately before interruption of the corresponding gates, as shown as (C) and (D) in FIG. 3, are held at the outputs C and D of the holding circuits 11 and 35, respectively. The signals at the nodes C and D are fed through the buffer circuits 13 and 37, respectively, to the signal synthesizing circuit 15. The signal synthesizing circuit 15 makes addition of these two signals. Accordingly, the output of the signal synthesizing circuit 15, i.e. the input E of the stereo demodulating circuit 113 receives a signal with a stereo pilot signal removed, as shown as (E) in FIG. 3. Since the input E of the stereo demodulating circuit 113 is not supplied with a stereo pilot signal, stereo demodulation is not adversely affected by a disturbed stereo pilot signal, as shown as (C) in FIG. 3.

In the FIG. 2 embodiment, the pilot signal was extracted from the stereo composite signal obtained from the holding circuit 11 by means of the extracting circuit 17 and was applied to the phase locked loop 19, i.e. the subcarrier wave signal generating circuit. However, since the phase locked loop 19 comprises the low pass filter 23, even when the stereo composite signal is applied to the phase locked loop 19, such stereo composite signal component is removed by the low pass filter 23 after phase comparison by the phase comparator 21 and therefore the pilot signal extracting circuit 17 may be omitted.

The output signal of the second frequency divider 29 included in the phase locked loop 19 is a rectangle wave signal of 19 kHz. If and when a rectangle wave signal of 19 kHz having the same phase as that of the pilot signal included in the stereo composite signal is used as the output of the pseudo-reference signal being obtained from the circuit 31, then the circuit 31 may be omitted. Meanwhile, in such a case the signal synthesizing circuit 15 may be structured as a subtraction circuit for making subtraction of these two signals having the same phase. In such a case, the pilot signal extracted from the pilot signal extracting circuit 17 may be directly applied as the pseudo-reference signal being applied to the other input of the signal synthesizing circuit 15.

Figure 4:
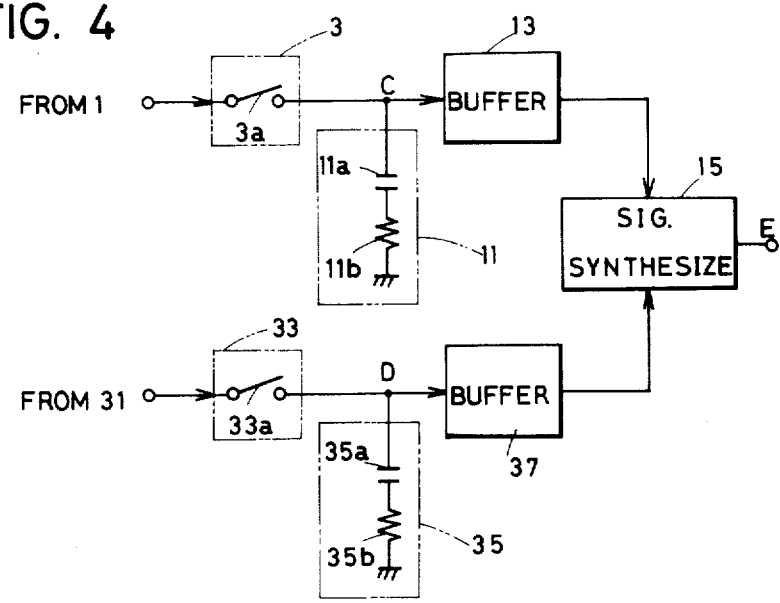
FIG. 4 is a block diagram showing a major portion of a modification of the FIG. 1 block diagram.

FIG. 4 is a block diagram showing only a major portion of a modification of the FIG. 2 embodiment. The FIG. 4 embodiment comprises the holding circuits 11 and 35 which are structured in a different manner from the FIG. 2 embodiment. More specifically, the holding circuit 11 comprises a series connection of a holding capacitor 11a and a resistor 11b. Similarly the holding circuit 35 comprises a series connection of a holding capacitor 35a and a resistor 35b. In the FIG. 4 embodiment as well as in other embodiments, the charging/discharging time constants of the holding circuits 11 and 35 are preferably selected to be substantially the same.

By implementing the holding circuit 11 as a series connection of the capacitor 11a and the resistor 11b, the pilot signal included in the stereo composite signal obtained from the gate circuit 3 is stored with a decreased rate, as compared with the FIG. 2 embodiment, in the holding capacitor 11a as a function of the resistor 11b. More specifically, due to the resistor 11b, the low frequency signal level held in the holding capacitor 11a becomes less influenced by a high frequency signal such as the stereo subcarrier wave signal, with the result that a more accurate level is maintained. Similarly, the pseudo-reference signal obtained form the gate circuit 33 is also stored in a smaller rate as compared with the FIG. 2 embodiment in the holding capacitor 35a by virtue of the resistor 35b of the holding circuit 35. Accordingly, by making extremely large the values of the resistors 11b and 35b as compared with the impedance values of the capacitors 11a and 35a in terms of the frequency of 19 kHz, a frequency component of 19 kHz is very little stored in the holding capacitors 11a and 35a, and in such a case since it is not necessary to hold the pseudo-reference signal being fed to the signal synthesizing circuit 15, the holding circuit 35 may be omitted.

Figure 5:
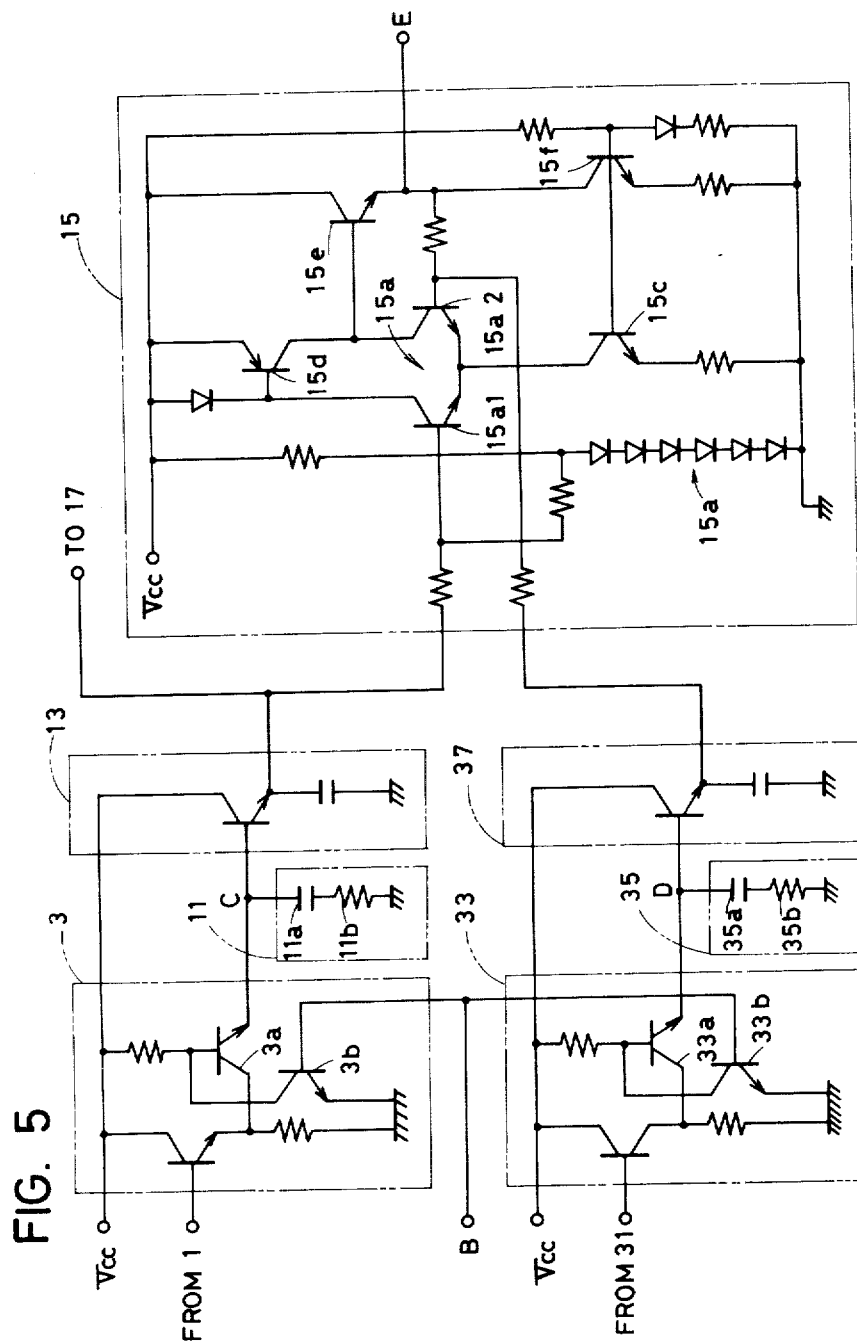

FIG. 5 is a schematic diagram showing in more detail the major portion of the above described embodiment. Referring to the FIG. 5 embodiment, the signal synthesizing circuit 15 is structured to comprise a subtraction circuit. More specifically, FIG. 5 shows an embodiment in which two inputs to the signal synthesizing circuit 15 are applied in the same phase.

Referring to FIG. 5, the gate circuits 3 and 33 comprise gates 3a and 33a implemented by transistors. The gate transistors 3a and 33a are placed in an interrupted state, when transistors 3b and 33b connected to the base electrodes thereof are rendered in a conductive state responsive to the gate control signal shown as (B) in FIG. 3 obtained from the wave shaping circuit 9. Accordingly, the stereo composite signal obtained from the delay circuit 1 is allowed to pass or interrupted by the gate transistor 3a and the pseudo-reference signal obtained from the circuit 31 is allowed to pass or interrupted by the gate transistor 33a. The outputs of the gate circuits 3 and 33 are held in the holding circuits 11 and 35, respectively. The holding circuits 11 and 35 comprise a series connection of a capacitor 11a and a resistor 11b and a series connection of a capacitor 35a and a resistor 35b, respectively. Buffer circuits 13 and 37 are connected to the output terminals of the holding circuits 11 and 35, i.e. the nodes C and D, respectively. The buffer circuits 13 and 37 are aimed to prevent the electric charge stored in the holding capacitors 11a and 35a included in the holding circuits 11 and 35, respectively, and each comprise a high impedance circuit. The outputs from the buffer circuits 13 and 37 are applied to the signal synthesizing circuit 15.

Figure 6:
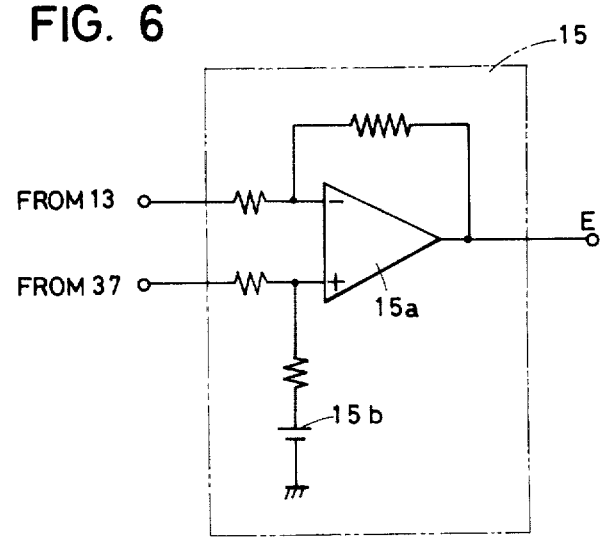
FIGS. 5 and 6 are schematic diagrams showing major portions of the FIG. 1 block diagram.

The signal synthesizing circuit 15 comprises a differential amplifier 15a as shown in FIG. 6. A constant voltage source 15b is connected to one input terminal of the differential amplifier 15a. Referring to FIG. 5, the differential amplifier 15a comprises a pair of transistors 15a1 and 15a2 and the constant voltage source 15b comprises a plurality of diodes connected in series. The pair of transistors 15a1 and 15a2 have the emitter electrodes thereof commonly connected to the transistor 15c constituting a constant current source. The transistor 15d is connected to the collector electrode of one transistor 15a2 of the above described pair of transistors, so that a current flowing through the transistor 15a2 is supplied. Accordingly, a current associated with a difference between the currents flowing through the pair of transistors 15a1 and 15a2 flows through the transistor 15d and accordingly an output associated with the reference current is obtained from the output transistor 15e. A transistor 15f constitutes a current voltage source. Since it is believed that a more detailed operation of the FIG. 5 embodiment will be readily understood by those skilled in the art based on the foregoing description, a detailed description thereof will be omitted.

Figure 7:
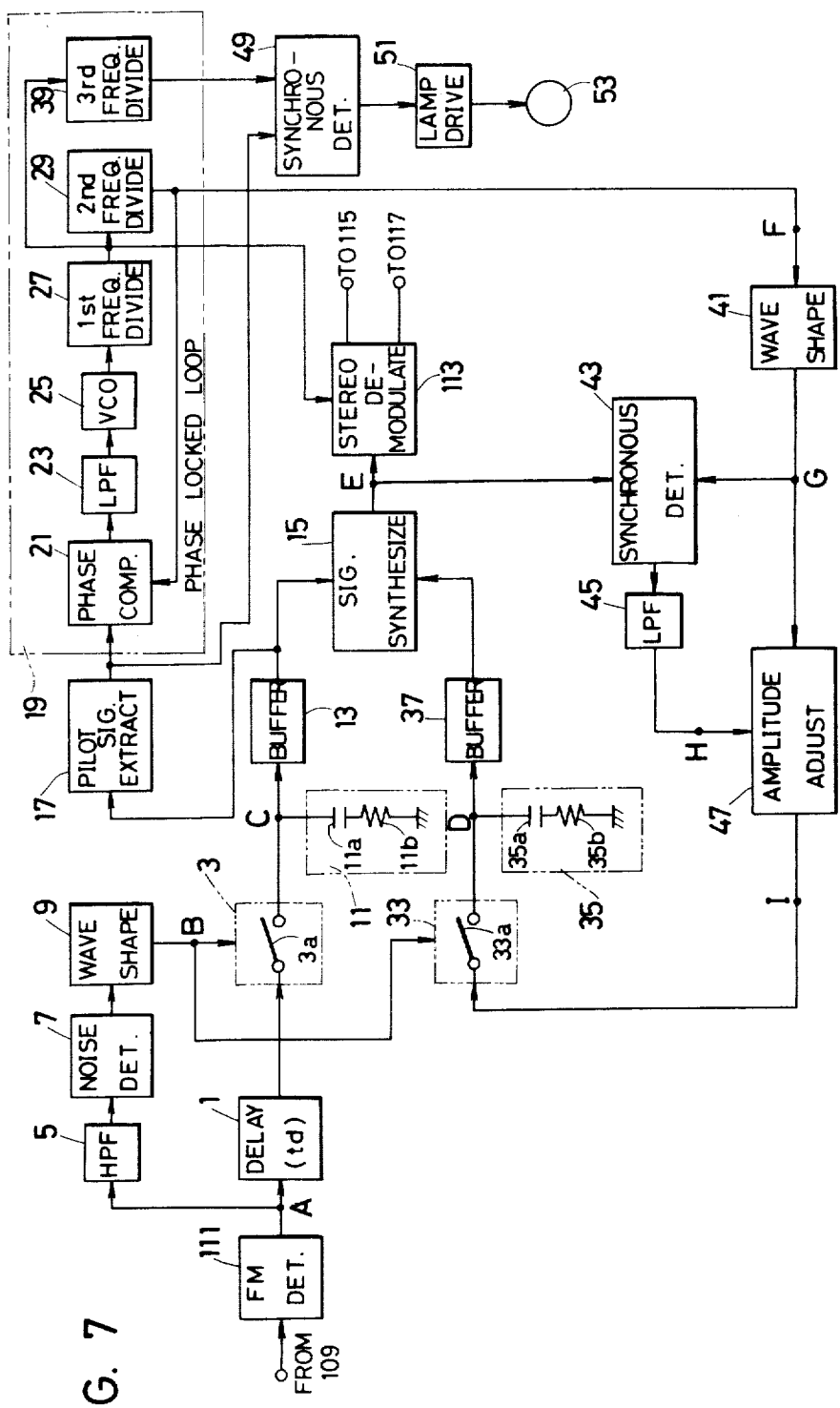
FIG. 7 is a block diagram showing another embodiment of the present invention.

FIG. 7 is a block diagram showing another embodiment of the present invention. Referring to the FIG. 7 embodiment, like portions have been denoted by the same reference characters as used in conjunction with the FIG. 2 embodiment and a repetitive description thereof will be avoided.

The FIG. 7 embodiment further comprises a third frequency divider 39 in the phase locked loop 19. The third frequency divider 39 frequency divide the signal of 38 kHz obtained from the first frequency divider 27, as the second frequency divider 29, thereby to provide a signal of 19 kHz. The pseudoreference signal of 19 kHz out of phase in quadrature with respect to the pilot signal (reference signal) extracted from the pilot signal extracting circuit 17 is generated at the output of the second frequency divider 29. On the other hand, an output signal of 19 kHz of the opposite phase with respect to the pilot signal extracted from the pilot signal extracting circuit 17 is obtained from the third frequency divider 39.

Figure 9:
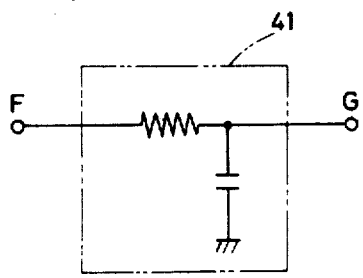
FIGS. 9, 10 and 11 are schematic diagrams showing major portions of the FIG. 2 embodiment.

The output from the second frequency divider 29 is applied to the wave shaping circuit 41. The wave shaping circuit 41 is aimed to convert the output signal from the frequency divider 29, i.e. the rectangle wave signal, into a triangle wave signal, for example, and comprise an integration circuit as shown in FIG. 9, for example. The output from the wave shaping circuit 41, i.e. the triangle wave signal of 19 kHz, is obtained as a signal of the opposite phase with respect to the pilot signal (reference signal) included in the stereo composite signal and is applied to one input of the first synchronous detecting circuit 43 and is also applied to the amplitude adjusting circuit 47. The first synchronous detecting circuit 43 is also connected to receive the output signal from the signal synthesizing circuit 15. More specifically, the first synchronous detecting circuit 43 synchronously detects the signal obtained at the input of the stereo demodulating circuit 113 as a function of the output signal of the wave shaping circuit 41 and provides at the output terminal thereof, i.e. the node E a signal associated with the magnitude of the stereo pilot signal remaining at the input terminal of the stereo demodulating circuit 113. The output of the synchronous detecting circuit 43 is converted into a direct current voltage by means of the low pass filter 45 and the output of the low pass filter 45, i.e. the direct current voltage associated with the magnitude of the remaining stereo pilot signal is applied to the above described amplitude control circuit 47 as a control input signal. The amplitude adjusting circuit 47 adjusts the amplitude of the signal obtained from the waveshaping circuit 41 as a function of a direct current voltage level obtained from the low pass filter 45 and the output of the amplitude thus adjusted is applied to the second gate circuit 33.

The signal of 19 kHz obtained from the third frequency divider 39 as well as the output obtained from the pilot signal extracting circuit 17 is applied to the second synchronous detecting circuit 49. The second synchronous detecting circuit 49 synchronous detect the stereo pilot signal (reference signal) extracted from the pilot signal extracting circuit 17 and the signal of 19 kHz obtained from the third frequency divider 39 and the output thereof is applied to the driver circuit 51. The driver circuit 51 is responsive to the output of the synchronous detecting circuit 49 to energize a display lamp 53, so that the display lamp 53 makes display as to whether or not the signal is stereo. More specifically, if and when the display lamp 53 is turned on, this means that the FM signal as received is of the stereo broadcasting.

Figure 8:
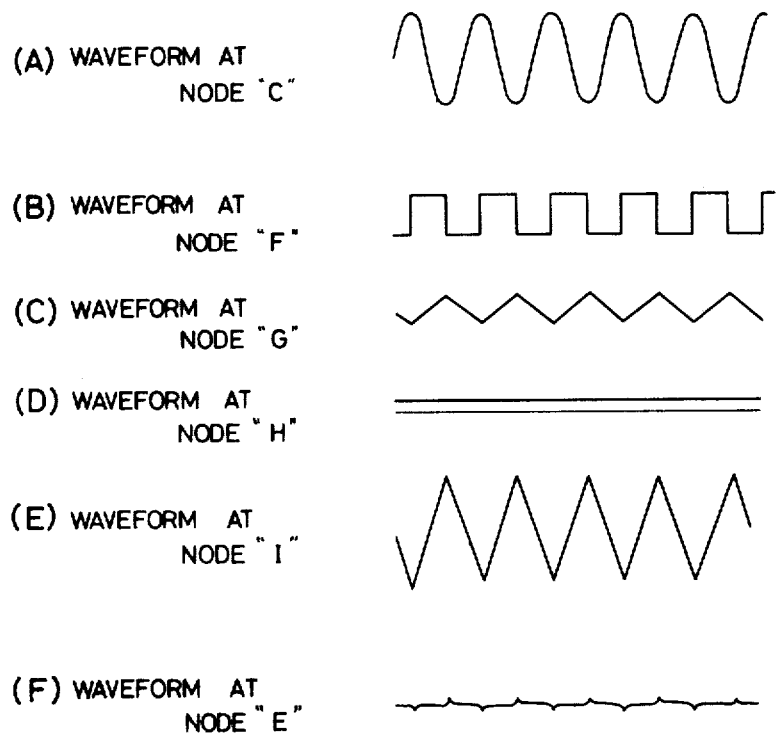
FIG. 8 is a graph showing waveforms of the signals at various portions of the FIG. 7 embodiment for depicting an operation thereof.

The FIG. 7 embodiment also performs the same noise removing operation as the FIG. 2 embodiment does. More specifically, the FIG. 7 embodiment performs substantially the same operation as that of the FIG. 2 embodiment, except that the output from the amplitude adjusting circuit 47, i.e. the pseudo-reference signal applied to the signal synthesizing circuit 15 is a triangle wave signal and that the amplitude of the triangle wave signal is adjusted in the circuit 47. Accordingly, in the following an amplitude adjusting operation by the FIG. 7 embodiment will be described with reference to the waveforms as shown in FIG. 8. It is again pointed out that as in the case of the waveforms shown in FIG. 3 the waveforms shown in FIG. 8 have been also illustrated to show only the signal component of 19 kHz, while other signal components have been omitted.

The FIG. 7 embodiment has been adapted such that the level of the pseudo-reference signal is adjusted at the amplitude adjusting circuit 47, so that the output as synthesized by the signal synthesizing circuit 15, i.e. the stereo pilot signal (reference signal) in the input terminal or the node E of the stereo demodulating circuit 113 may not remain. Such offsetting of the reference signal and the pseudo-reference signal in the signal synthesizing circuit 15 is performed even when no pulsive noise exist, as in the case of the FIG. 2 embodiment. Accordingly, for facility of understanding, the FIG. 8 waveforms have been illustrated to show the waveforms in such a normal case. Referring to FIG. 8, (A) shows a waveform of the pilot signal obtained at the output terminal or the node C of the first holding circuit 11, and (B) shows the rectangle waveform signal of 19 kHz obtained from the second frequency divider 29 or the signal at the node F. The wave shaping circuit 41 (including an integrating circuit as shown in FIG. 9) serves to convert such rectangle wave signal into a triangle wave signal as shown as (C) in FIG. 8. The thus converted triangle wave signal is of the opposite phase as compared with the pilot signal (shown as (A) in FIG. 8).

Accoridngly, it would be appreciated that the waveforms shown are of the case where the signal synthesizing circuit 15 comprises an addition circuit. Meanwhile, although it is also naturally concievable to make the triangle wave signal as shown the same phase as the pilot signal, in such a case it is necessary that the signal synthesizing circuit 15 comprises a subtraction circuit, as described previously.

The synchronous detecting circuit 43 synchronous detects the output from the signal synthesizing circuit 15, i.e. the input of the stereo demodulating circuit 113 (shown as (F) in FIG. 8) as a function of the above described triangle wave signal. Accordingly, a direct current voltage having a level corresponding to the magnitude of the signal as shown as (F) in FIG. 8 is obtained at the node H as the output of the low pass filter 45. The gain of the amplifier included in the amplitude adjusting circuit 47 is controlled responsive to the above described direct current voltage and the triangle wave signal as amplified as shown as (E) in FIG. 8 is obtained at the node G from the amplitude adjusting circuit 47. The above described triangle wave signal is added in the signal synthesizing circuit 15 to the pilot signal as shown as (A) in FIG. 8 and as a result the signal as shown as (F) in FIG. 8 is obtained from the signal synthesizing circuit 15. Accordingly, the level of the reference signal component included in the output obtained from the signal synthesizing circuit 15 can be reduced to approximately zero by means of the above described loop for amplitude adjustment. More specifically, if and when a signal component of 19 kHz is included in the output obtained from the signal synthesizing circuit 15, then the same is detected by means of the synchronous detecting circuit 43 and the amplitude of the triangle wave signal is magnified by the amplified adjusting circuit 47 which serves to more fully offset the pilot signal component. Through repetition of such operation, it follows that a signal component of 19 kHz is caused not to appear ultimately at the output of the signal synthesizing circuit 15 or the node E.

Meanwhile, since the stereo pilot signal, i.e. the reference signal is not always applied to the input E of the stereo demodulating circuit 113 in the case of the embodiments shown in FIGS. 2 and 7, it is not necessary to provide any filter for removing such pilot signal at the stage subsequent to the stereo demodulating circuit 113. Accordingly, a high frequency region characteristic of the output obtained from the stereo demodulating circuit 113 is not degraded by such a filter. In particular, since the FIG. 7 embodiment was adapted such that the amplitude level of the pseudo-reference signal is adjusted by the synchronous detecting circuit, the reference signal can be more fully canceled and a better result is attained.

Figure 10:
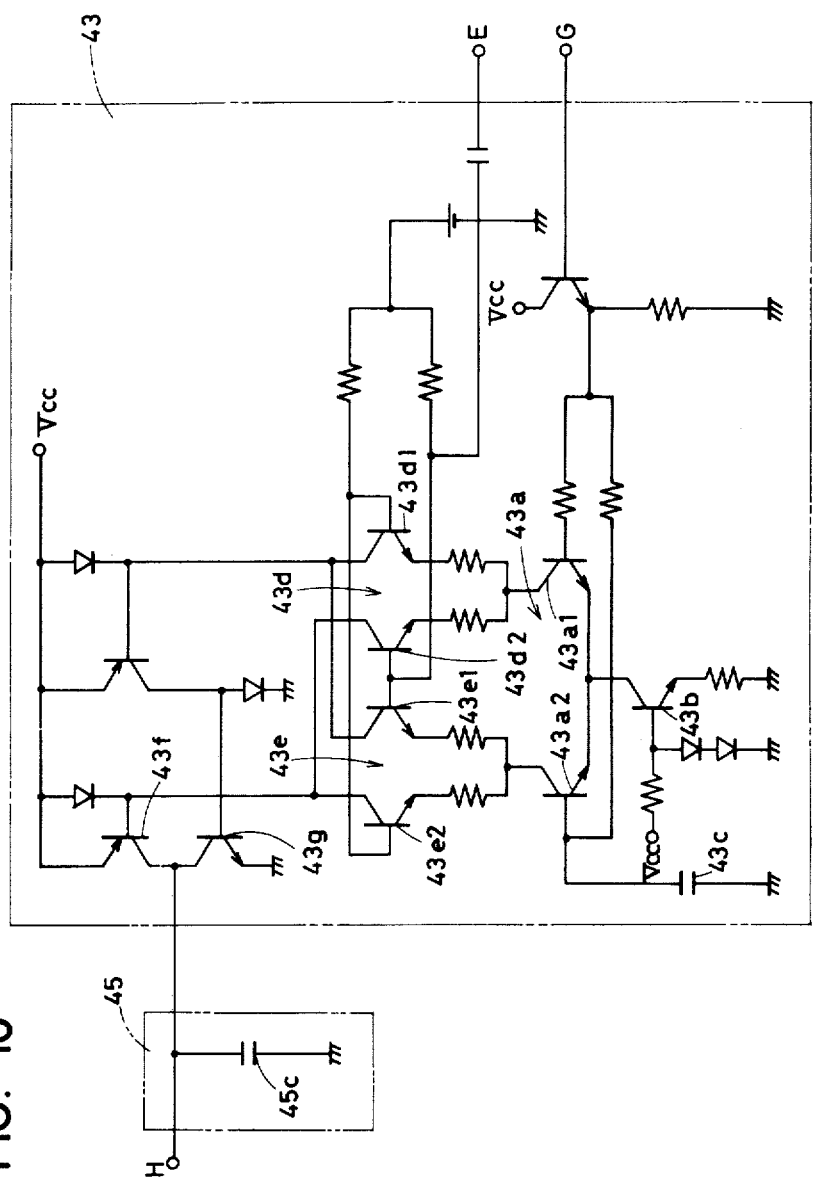

FIG. 10 is a schematic diagram of the synchronous detecting circuit 43 and the low pass filter 45. The synchronous detecting circuit 43 is connected to receive the output of the signal synthesizing circuit 15, i.e. the signal at the node E and the output obtained from the wave shaping circuit 41, i.e. the signal at the node G as described previously. The output of the wave shaping circuit 41 is applied to a pair of transistors 43a1 and 43a2 which constitute a differential amplifier 43a. The emitter electrodes of the paired transistors 43a1 and 43a2 are connected to a transistor 43b constituting a constant current source. A capacitor 43c connected to the transistor 43a2 is aimed to provide a constant voltage for balancing. The collector electrode of one transistor 43a1 of the differential amplifier 43a is connected to a differential amplifier 43d including a pair of transistors 43d1 and 43d2 and the collector electrode of the other transistor 43a2 is connected to a differential amplifier 43e including a pair of transistors 43e1 and 43e2. The output obtained from the signal synthesizing circuit 15 is applied to the differential amplifiers 43d and 43e. Accordingly, a current associated with the amplitude of the pilot signal component included in the signal synthesizing circuit 15 flows through the output transistors 43f and 43g of the synchronous detecting circuit 43. Since the current circuit implemented by the transistors 43f and 43g is structured to have a relatively high impedance, the low pass filter 45 need not be implemented by an RC circuit and therefore is implemented by only a capacitor 45a in the embodiment shown. The output of the low pass filter 45 is a direct current voltage as shown as (D) in FIG. 8 which is proportional to the amplitude of the remaining reference signal component as shown as (F) in FIG. 8, as described previously.

Figure 11:
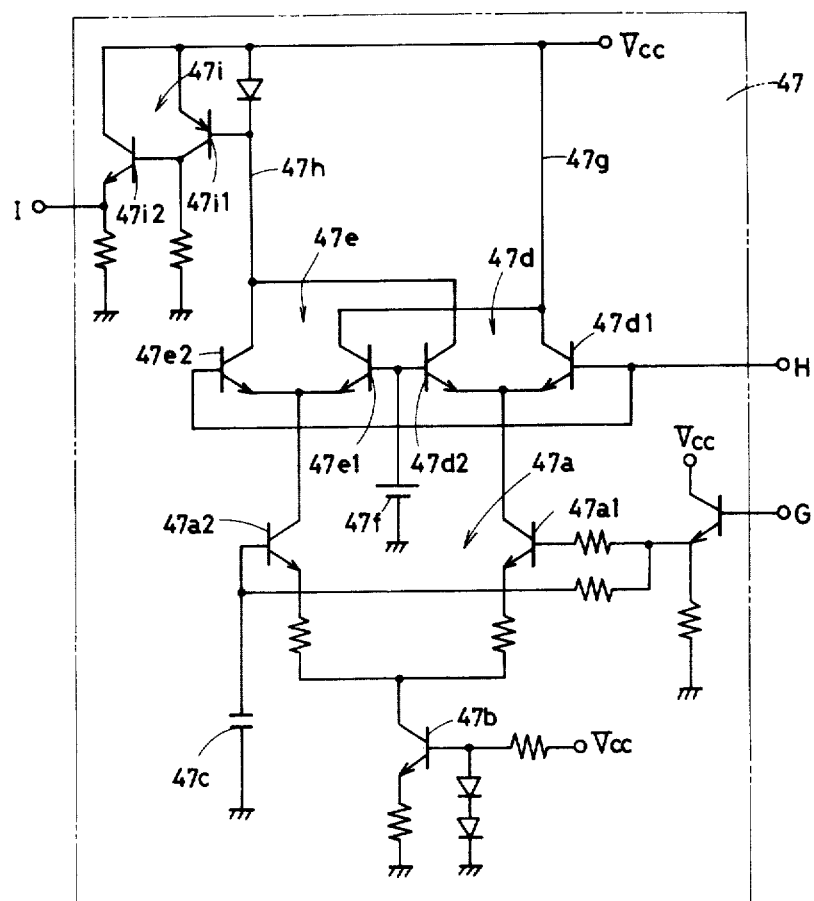

FIG. 11 is a schematic diagram of the amplitude adjusting circuit 47. The amplitude adjusting circuit 47 is connected to receive the triangle wave signal obtained from the wave shaping circuit 41, i.e. the signal at the node G and the direct current voltage obtained from the low pass filter 45, i.e. the signal obtained at the node H. The triangle wave signal is applied to the differential amplifier 47a constituted by a pair of transistors 47a1 and 47a2. The paired transistors 47a1 and 47a2 are each connected through emitter resistors to a transistor 47b constituting a constant current source. A capacitor 47c constitutes a voltage circuit which is similar to the previously described capacitor 43c. The collector electrode of one transistor 47a1 of the differential amplifier 47a is connected to a differential amplifier 47d comprising a pair of transistors 47d1 and 47d2, while the other transistor 47a2 is connected to a differential amplifier 47e comprising a pair of transistors 47e1 and 47e2. The differential amplifiers 47d and 47e serve to divide a current amount flowing through one line 47g and the other line 47h as a function of the magnitude of the direct current voltage obtained from the low pass filter 45 and the magnitude of the voltage of the constant voltage source 47f. The output circuit 47i comprises a transistor 47i1 connected to one line 47h and a transistor 47i2 connected to the transistor 47i1. Accordingly, the maximum gain of the amplitude adjusting circuit 47 is determined by a ratio of the emitter resistors of the transistors 47a1 and 47a2 and the collector resistor of the transistor 47i1. Accordingly it would be appreciated that the amplitude adjusting circuit 47 is responsive to the direct current voltage level obtained from the low pass filter 45 to adjust the amplitude of the triangle wave signal obtained from the wave shaping circuit 41. Since it is believed that a more detailed description of the operation of the diagrams shown in FIGS. 10 and 11 would be apparent to those skilled in the art from the foregoing description, a more detailed description thereof will be omitted.

Figure 12:
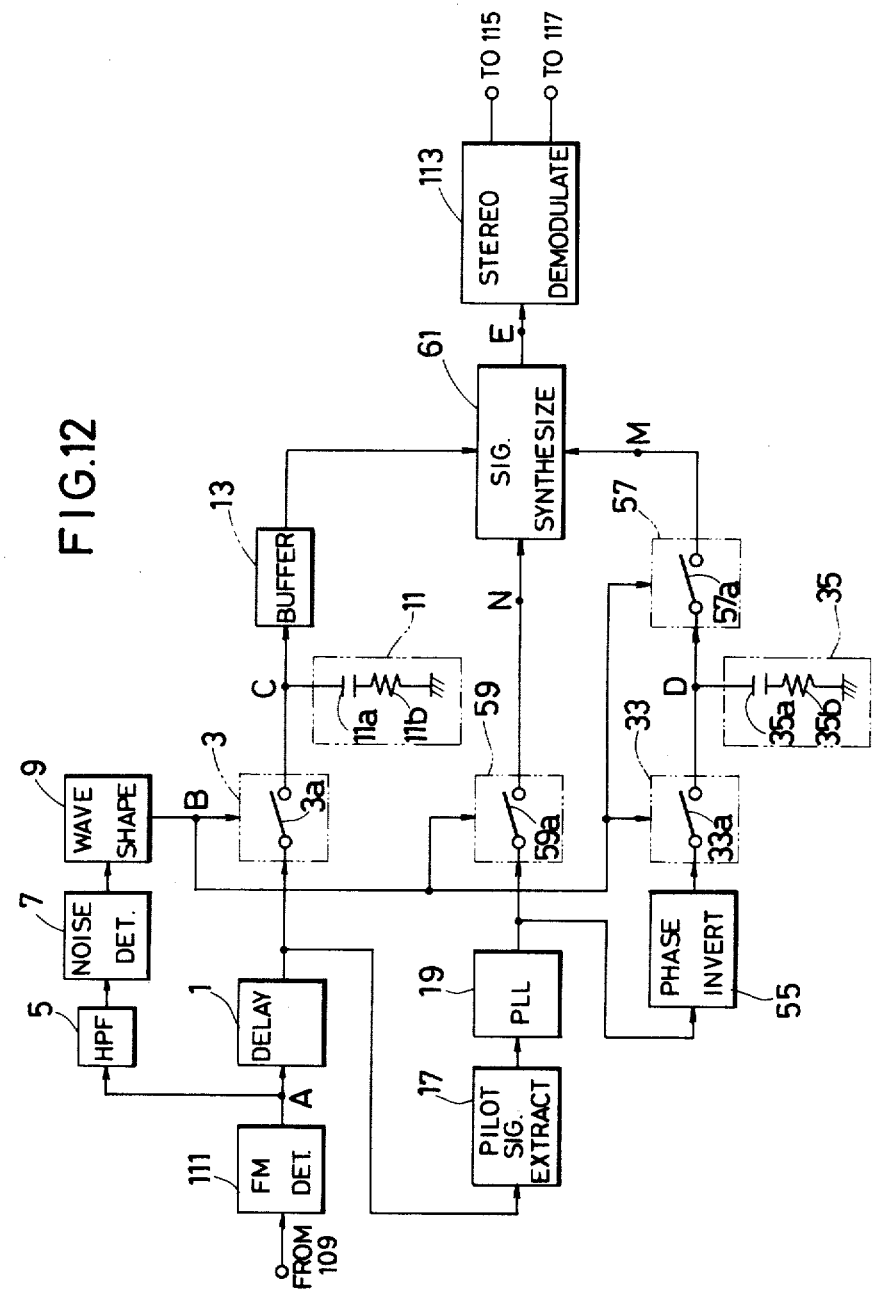
FIG. 12 is a block diagram showing a further embodiment of the present invention.

FIG. 12 is a block diagram showing another embodiment of the present invention. Referring to the FIG. 12 embodiment, those portions performing the same operation as that of the FIG. 2 embodiment have been denoted by the same reference characters and a more detailed description thereof will be omitted. However, the FIG. 12 embodiment is different from the embodiments shown in FIGS. 2 and 7 in that the stereo pilot signal (the reference signal) is always applied to the stereo demodulating circuit 113. Nevertheless, the principle of removing a pulsive noise of the FIG. 12 embodiment is the same as that of the previously described embodiments as a matter of course.

Whereas the FIG. 2 embodiment was structured such that the pilot signal is extracted from the output terminal of the holding circuit 11 or the node C by means of the pilot signal extracting circuit 17 and is applied to the phase locked loop 19, whereby the pseudo-reference signal was generated, the FIG. 12 embodiment is structured such that the pilot signal is extracted from the FM stereo composite signal obtained from the stage subsequent to the delay circuit 1. Therefore, the pilot signal extracting circuit 17 is connected between the delay circuit 1 and the gate circuit 3. Such a circuit 19 as a phase locked loop for generating a signal of 19 kHz (pseudo-reference signal) is connected to the pilot signal extracting circuit 17 to receive the extracted pilot signal. The pseudo-reference signal obtained from the phase locked loop 19 is applied to a phase inverting circuit 55 and is also applied through a fourth gate circuit 59 to a signal synthesizing circuit 61. The signal of 19 kHz obtained from the phase locked loop 19 is considered here as a sine wave signal. The output of the phase inverting circuit 55 is applied through a second gate circuit 33 to a second holding circuit 35. The output of the second holding circuit 35 is applied through a third gate circuit 57 to the signal synthesizing circuit 61. The gate 57a included in the third gate circuit 57 and the gate 59a included in the fourth gate circuit 59 are coupled to be operable in the phase opposite to or in a manner complementary to the first and second gates 3a and 33a. More specifically, it is adapted such that if and when the gates 3a and 33a are in a conductive state, the gates 57a and 59a are in an interrupted state, whereas if and when the gates 3a and 33a are in an interrupted state, the gates 57a and 59a are in a conductive state. The signal synthesizing circuit 61 is structured to synthesize the signal obtained at the output of the first holding circuit 11 or the signal obtained at the node C, the signal obtained at the output terminal of the third gate circuit 57 or the signal obtained at the node M, and the signal obtained at the output terminal of the fourth gate circuit 59 or the signal obtained at the node N. In the embodiment shown the output of the signal synthesizing circuit 61, i.e. the input or the node E of the stereo demodulating circuit 113 is always kept supplied with the reference signal, i.e. a normal stereo pilot signal.

Figure 13:
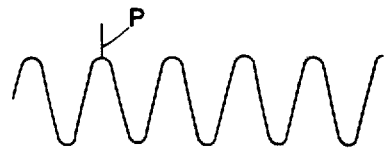
FIG. 13 is a graph showing waveforms of the signals at various portions of the FIG. 12 embodiment for depicting an operation thereof.
Figure 13:
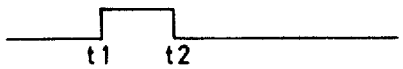
Figure 13:
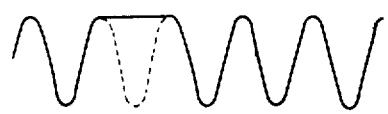
Figure 13:
Figure 13:
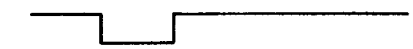
Figure 13:
Figure 13:
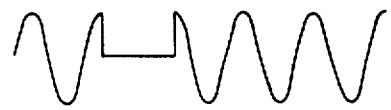
Figure 13:

Now that the structural features of the FIG. 12 embodiment were described, an operation of the FIG. 12 embodiment will be described with reference to the waveforms shown in FIG. 13. In operation, first consider a case where no noise component is included in the FM stereo composite signal. In such a case, no gate control signal is obtained from the wave shaping circuit 9. Accordingly, the first gate circuit 3 and the second gate circuit 33 remain in a conductive state. On the contrary, the third gate circuit 57 and the fourth gate circuit 59 remain in an interrupted state. Therefore, the output signal obtained from the FM detecting circuit 111 is obtained through the delay circuit 1, the first gate circuit 3 and the holding circuit 11 at the output terminal C. On the other hand, the third gate circuit 57 and the fourth gate circuit 59 both remain in an interrupted state and any signal other than the signal obtained at the node C is not applied to the signal synthesizing circuit 61. Accordingly, the signal synthesizing circuit 61 supplies the signal obtained at the node C as such to the stereo demodulating circuit 113. More specifically, a pilot signal is included in the FM stereo composite signal being fed to the stereo demodulating circuit 113. However, in the absence of a noise component such as a pulsive noise, no interruption of the gate circuits do not occur and therefore no disturbance occurs in such pilot signal. Accordingly, in the absence of a pulsive noise, the stereo demodulating circuit 113 is kept supplied with a normal pilot signal.

Now consider a case where a pulsive noise is superimposed on the stereo composite signal. Let it be assumed that a pulsive noise is superimposed at the timing t1, as shown as (A) in FIG. 13. Then the pulsive noise P passes through the high pass filter 5 and is detected by the noise detector 7. Accordingly, a gate control signal is obtained at the wave shaping circuit 9 including a monostable multivibrator which assumes the high level from the timing t1 for a predetermined time period up to the timing t2 as shown as (B) in FIG. 13. Accordingly, the gates 3a and 33a of the first and second gate circuits 3 and 33 are interrupted responsive to the gate control signal or the signal obtained at the node B. Therefore, a signal as shown as (C) in FIG. 13 is obtained at the node C of the first holding circuit 11, while a signal as shown as (D) in FIG. 13 is obtained at the node D of the second holding circuit 35. Such operation is the same as that of the FIG. 2 embodiment. The third and fourth gate circuits 57 and 59 are responsive to the gate control signal obtained from the wave shaping circuit 9 to be rendered in a conductive state for a time period of the gate control signal. Therefore, a signal as shown as (E) in FIG. 13 is obtained at the output of the third gate circuit 57 or the node M. On the other hand, the pseudo pilot signal obtained from the phase locked loop 19 is applied to the output terminal of the fourth gate circuit 59 or the node N only for a time period of the gate control signal as shown as (F) in FIG. 13. Accordingly, a pilot signal or a reference signal without any disturbance as shown as (H) in FIG. 13 is obtained at the output terminal of the signal synthesizing circuit 61 or the input terminal of the stereo demodulating circuit 113 or the node E. Meanwhile, the wave (G) shown in FIG. 13 denotes the result of addition or the sum of the signal obtained at the node C and the signal obtained at the node M and the pilot signal as shown as (H) in FIG. 13 is considered as the waveform obtained through superposition of the waveform shown as (F) in FIG. 13 on the waveform as shown as (G) in FIG. 13. Thus, upon occurrence of a pulsive noise P, the pulsive noise is removed by the first gate circuit 3. On the other hand, during a time period when the first gate 3 is in an interrupted state, the reference signal or the stereo pilot signal would have been disturbed during that time period; however, since the fourth gate circuit 59 is rendered in a conductive state, a normal pilot signal is instead applied to the signal synthesizing circuit 61, with the result that no disturbance occurs in the pilot signal being applied to the stereo demodulating circuit 113.

Meanwhile, it is a matter of course that even in the case of the FIG. 12 embodiment the holding circuits 11 and 35 may be implemented not only by the capacitors 11a and 35a but also by series connected resistors corresponding to the resistors 11b and 35b in the FIG. 4 embodiment.

Furthermore, if and when a subcarrier wave generator for the stereo demodulating circuit 113 is available such as in an FM stereo receiver, then it might not be necessary to particularly prepare the pilot signal extracting circuit 17 and the phase locked loop 19 as shown in FIG. 12.

Figure 14:
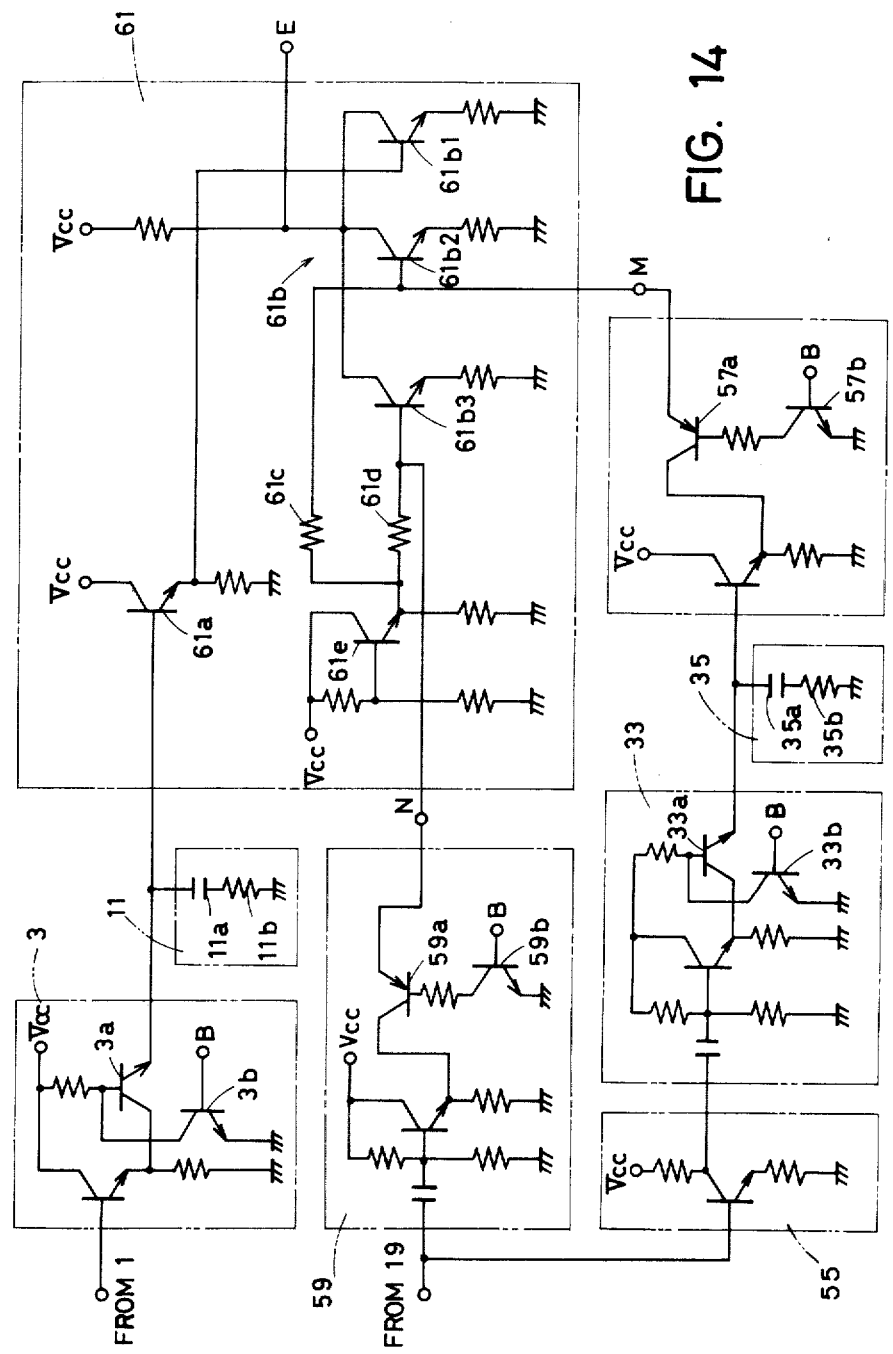
FIG. 14 is schematic diagram showing a major portion of the FIG. 12 embodiment.

FIG. 14 is a schematic diagram showing a major portion of the FIG. 12 embodiment. Referring to FIG. 14, the first gate circuit 3 is the same as that shown in FIG. 5 and the second gate circuit 33 is also the same as shown in FIG. 5. Furthermore, the third and fourth gate circuits 57 and 59 are structured in substantially the same manner as that of the previously described embodiment except that the gate transistors 57a and 59a are of the opposite conductivity type as compared with the previously described gate transistors 3a and 33a. The signal synthesizing circuit 61 comprises a transistor 61a constituting a buffer circuit coupled to the node C for preventing a discharge of the holding capacitor 11a. The output from the buffer transistor 61a is applied to one transistor 61b constituting an addition circuit 61b. At the same time the node M of the third gate circuit 57 is connected to the other transistor 61b2 constituting the addition circuit 61b. The remaining transistor 61b3 constituting the addition circuit 61b is connected to the node N of the fourth gate circuit 59. The collector electrodes of these transistors 61b1 and 61b2 and 61b3 are commonly connected to the output terminal of the signal synthesizing circuit 61 and to the node E of the stereo demodulating circuit 113. Accordingly, it would be appreciated that the output terminal E is supplied with a signal obtained as a result of synthesization of the signals obtained at these three output terminals C, M and N. Meanwhile, referring to FIG. 14, the resistors 61c and 61d are aimed to provide direct current biases to the transistors 61b2 and 61b3, respectively. More specifically, if and when the third and fourth gate circuits 57 and 59 are interrupted, these transistors 61b2 and 61b3 are not supplied with a direct current voltage, resulting in a fluctuation of the bias level; however, the direct current voltages from these resistors 61b and 61d serve to prevent such fluctuation. The transistor 61e constitutes a constant voltage source for supplying a direct current bias.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for removing a noise in a composite signal including an information signal and a reference signal of a predetermined frequency, said apparatus comprising:

means for providing said composite signal, means responsive to said composite signal providing means for detecting a noise signal included in said composite signal, means responsive to said noise signal detecting means for providing an enabling signal during a predetermined time period upon occurrence of said noise signal, first gate means responsive to said enabling signal from said enabling signal providing means for interrupting for said predetermined time period transmission of said composite signal from said composite signal providing means, first store means coupled to the output of said first gate means for holding a signal level of the output of said first gate means immediately before interruption of transmission of said composite signal by said first gate means, pseudo-reference signal generating means responsive to said reference signal included in said composite signal for generating a pseudo-reference signal having substantially the same frequency as that of said reference signal, second gate means responsive to said enabling signal for interrupting for said predetermined time period transmission of said pseudo-reference signal from said pseudo-reference signal generating means, and signal synthesizing means for synthesizing the output of said first store means and the output of said second gate means for a time period associated with at least said predetermined time period.

2. A noise removing apparatus in accordance with claim 1, which further comprises second store means coupled to the output of said second gate means for holding the signal level of said pseudo-reference signal immediately before interruption of transmission of said pseudo-reference signal by said second gate means, and wherein said signal synthesizing means is adapted for synthesizing the output of said first store means and the output of said second store means.

3. A noise removing apparatus in accordance with claim 2, wherein said first and second store means comprise first and second time constant circuit means, respectively, and the time constants of said first and second time constant circuit means are selected to be substantially the same.

4. A noise removing apparatus in accordance with claim 1, which further comprises reference potential means defining a reference potential, and wherein said first store means comprises first capacitor means coupled between the output of said first gate means and said reference potential.

5. A noise removing apparatus in accordance with claim 4, wherein said first store means comprises first resistor means connected in series with said first capacitor means.

6. A noise removing apparatus in accordance with claim 5, wherein said first capacitor means is selected to have an impedance which is larger than the resistance value of said first resistor means in a frequency region of said information signal and is smaller than the resistance of said first resistor means in the frequency region of said reference signal.

7. A noise removing apparatus in accordance with claim 2, wherein said second store means comprises second capacitor means coupled between the output of said second gate means and said reference potential.

8. A noise removing apparatus in accordance with claim 7, wherein said second store means further comprises second resistor means connected in series with said second capacitor means.

9. A noise removing apparatus in accordance with claim 8, said second capacitor means included in said second store means is selected to have an impedance which is larger than the resistance of said second resistor means in the frequency region of said pseudo-reference signal.

10. A noise removing apparatus in accordance with claim 1 further comprising means for adjusting the amplitude of said pseudo-reference signal.

11. A noise removing apparatus in accordance with claim 10, wherein said amplitude adjusting means comprises means responsive to said pseudo-reference signal and the output of said signal synthesizing means for providing a control signal associated with the level of said reference signal component included in the output of said signal synthesizing means, and amplitude controlling means responsive to said control signal obtained from said control signal providing means for controlling the amplitude of said pseudo-reference signal.

12. A noise removing apparatus in accordance with claim 11, wherein said control signal providing means comprises synchronous detecting means connected to receive the output of said signal synthesizing means and said pseudo-reference signal, and smoothing means coupled to receive the output of said synchronous detecting means.

13. A noise removing apparatus in accordance with claim 10, wherein said amplitude adjusting means comprises means responsive to the reference signal component of said composite signal and said pseudo-reference signal for providing a control signal associated with the levels of the reference signal component of said composite signal and said pseudo-reference signal, and amplitude controlling means responsive to said control signal from said control signal providing means for controlling the amplitude of said pseudo-reference signal applied to said second gate means.

14. A noise removing apparatus in accordance with claim 1, wherein said reference signal included in said composite signal obtainable at the output of said first store means and said pseudo-reference signal obtainable at the output of said second gate means are selected to be in phase, and said signal synthesizing means comprises analog subtracting means for performing subtraction of said reference signal and said pseudo-reference signal.

15. A noise removing apparatus in accordance with claim 15, wherein said analog subtracting means comprises a differential amplifier.

16. A noise removing apparatus in accordance with claim 1, wherein said reference signal included in said composite signal obtainable at the output of said first store means and said pseudo-reference signal obtained at the output of said second gate means are selected to be of the opposite phase, and said signal synthesizing means comprises analog addition means for performing addition of said reference signal and said pseudo-reference signal.

17. A noise removing apparatus in accordance with claim 1 or 2, which further comprises third gate means responsive to said enabling signal and operable in a complementary manner with respect to said first gate means for interrupting transmission of said pseudo-reference signal, and fourth gate means coupled to the output of said second gate means and responsive to said enabling signal and operable in a complementary manner with respect to said first gate means for interrupting transmission of the output of said second gate means, and wherein said signal synthesizing means is adapted for synthesizing the output of said first store means, the output of said third gate means and the output of said fourth gate means.

* * * * *